United States Patent [19]

Yilmaz et al.

[11] Patent Number: 5,136,349
[45] Date of Patent: Aug. 4, 1992

[54] CLOSED CELL TRANSISTOR WITH BUILT-IN VOLTAGE CLAMP

[75] Inventors: Hamza Yilmaz, Sunnyvale; Izak Bencuya, San Jose, both of Calif.

[73] Assignee: Siliconix Incorporated, Santa Clara, Calif.

[21] Appl. No.: 597,118

[22] Filed: Oct. 12, 1990

Related U.S. Application Data

[63] Continuation of Ser. No. 400,848, Aug. 30, 1989, abandoned.

[51] Int. Cl.$^5$ .............................................. H01L 29/10
[52] U.S. Cl. .................................. 357/23.4; 357/23.8; 357/13
[58] Field of Search .................. 357/23.4, 43, 23.8, 357/13

[56] References Cited

U.S. PATENT DOCUMENTS

| | | | |
|---|---|---|---|
| 4,642,674 | 2/1987 | Schoofs | 357/23.8 |
| 4,680,604 | 7/1987 | Nakagawa et al. | 357/43 |
| 4,760,431 | 7/1988 | Nakagawa et al. | 357/23.4 |
| 4,774,198 | 9/1988 | Contiero et al. | 357/23.4 |
| 4,775,879 | 10/1988 | Robb et al. | 357/23.4 |
| 4,777,521 | 10/1988 | Coe | 357/23.4 |
| 4,779,123 | 10/1988 | Bencuya et al. | 357/23.4 |
| 4,837,606 | 6/1989 | Goodman et al. | 357/23.4 |
| 4,916,085 | 4/1990 | Frisina | 357/43 |

FOREIGN PATENT DOCUMENTS

| | | | |
|---|---|---|---|
| 0133642 | 6/1984 | European Pat. Off. | 357/23.4 |
| 57-206073 | 12/1982 | Japan | 357/23.4 |
| 62-039069 | 2/1987 | Japan | 357/23.4 |
| 63-252480 | 10/1988 | Japan | 357/23.4 |
| 64-769 | 1/1989 | Japan | 357/23.4 |

OTHER PUBLICATIONS

H. Yilmaz et al., Insulated gate Transistor Modeling and Optimization, 1984, pp. 274–277 IEDM.
Victor A. K. Temple, MOS-Controlled Thyristors-A New Class of Power Devices, Oct. 1986, pp. 1609–1618, IEEE, vol. ED-33, No. 10.
H. Yilmaz, Cell Geometry Effect on IGT Latch-Up, IEEE Electron Device Letters, vol. EDL-6, No. 8, Aug. 1985.

*Primary Examiner*—Andrew J. James
*Assistant Examiner*—Courtney A. Bowers
*Attorney, Agent, or Firm*—Skjerven, Morrill, MacPherson, Franklin & Friel

[57] ABSTRACT

A power transistor takes advantage of the lower breakdown voltage capability of a spherical junction. A clamping region having a spherical shape is provided in the gater region of an enclosed transistor cell. The clamping region has a lower breakdown voltage than do the active portions of the transistor cell. Both a DMOSFET and an IGBT transistor may be provided with the clamping region. The clamping region is a zener diode in the case of the DMOSFET, and is a bipolar junction transistor in the case of the insulated gate bipolar transistor. The clamping region is preferably an island in the center of each cell of a closed cell structure.

18 Claims, 12 Drawing Sheets

CLOSED CELL TRANSISTOR WITH BUILT-IN VOLTAGE CLAMP

This application is a continuation of application Ser. No. 07/400,848, filed Aug. 30, 1989 now abandoned.

BACKGROUND OF THE INVENTION

1. Field of the Invention

This invention relates to a transistor and method for making a transistor with a built-in voltage clamp. More specifically the invention relates to a power switching transistor, such as a DMOS or insulated gate bipolar transistor, which has a built-in region which serves as a voltage clamp surrounded by the active portion of the transistor and which breaks down at a lower voltage than do the other junctions in the transistor.

2. Description of the Prior Art

DMOSFET's (double diffused metal oxide silicon field effect transistors) and IGBT s (insulated gate bipolar transistors) are well-known in the art. A typical example of one cell of a DMOSFET transistor is shown in FIG. 1A. The DMOSFET is a field effect transistor as shown having source regions 10a and 10b formed respectively in body 26 regions 12a, 12b which are in turn formed in an epitaxial layer 14 (i.e., a drain region) grown on a substrate 16. A gate 18 is formed over an insulating layer 20 on the principal surface 22 of the epitaxial layer 14. A drain contact 24 is attached to the backside of the substrate 16. A gate contact 28 and source/body contact 30 are also provided. FIG. 1A thus shows a conventional power DMOSFET.

An insulated gate bipolar transistor (IGBT) has a somewhat similar structure as the DMOSFET of FIG. 1A, except that for the IGBT substrate region 16 would be a P+ region (i.e., of opposite conductivity type to that of the expitaxial layer 14). The IGBT in effect is internally a field effect transistor (FET) with its source connected to the collector of a wide base bipolar transistor and its drain connected to the base of the wide base bipolar transistor. The emitter terminal of the wide base transistor then is referred to as the collector terminal of the IGBT; the collector terminal of the wide base transistor is referred to as the IGBT emitter terminal, and the FET gate terminal is the IGBT gate terminal. Thus for the IGBT corresponding to the structure of FIG. 1A, the epitaxial layer 14 is the base region. The body regions 12a, 12b are shorted to the IGBT emitter regions 10a, 10b. The substrate 16 (which is of P+type) is the IGBT collector region.

Therefore, the chief structural difference between an insulated gate bipolar transistor and a DMOSFET is in the conductivity type of the substrate. In an insulated gate bipolar transistor the epitaxial region is an open base region, meaning there is no electrical contact of that region to any external structures. This structure is also referred to as a floating base region.

Prior art power transistors typically include many (e.g., ten thousand) cells of the kind shown in FIG. 1A, each cell being identical. As shown in FIG. 1B in a top view, for a DMOSFET 32 each cell 34, 36, 38, 40 is a polygon such as a square which includes a central P+source region 34a, 36a, 38a, 40a formed in and surrounded by an N+ body region 34b, 36b, 38b, 40b. Each cell 34, 36, 38, 40 is in turn surrounded by a poly-crystalline silicon (i.e., polysilicon) conductive gate region 44 which is the conductive gate region for the entire transistor.

In another well known prior art cell structure (not shown), open linear cells are provided. Each cell typically includes a linear P+ source region formed in between linear N+ body regions. Between adjacent cells a polysilicon gate region is provided.

It is known that in devices such as shown in FIG. 1A, a diffused region such as collector region 12a (which is typically delineated by means of a window in a photo-etched oxide mask) is parallel plane in shape, with the exception of part of the region defined by the edge of the window in the oxide. At the edge of the window in the oxide, owing to diffusion effects, the region takes on a cylindrical shape in cross section. Thus the space charge lines at the window edge are distorted, resulting in an electric field that is different from the parallel plane electric field structure. Thus for a particular applied voltage, the peak electric field is higher for the cylindrical junction than for the parallel plane junction. Thus the breakdown voltage is lower for the cylindrical junction than for the parallel plane, and so breakdown tends to occur at the cylindrical junction.

It is also known in the art that at the curved region where two cylindrical junctions meet, such as at the corner of a rectangular shaped diffused region, a so-called spherical junction is formed. The electrical breakdown of a spherical junction typically occurs at an even lower breakdown voltage than is experienced with a cylindrical junction. This is because extremely small curvature radii are encountered at such sharp corner regions associated with a diffusion area which is masked through a rectangular window.

FIG. 1C shows that the breakdown voltage of a spherical junction is lower than the breakdown voltage of a cylindrical junction. The breakdown voltage of the spherical junction is typically about 60% of that of a cylindrical junction, where the radius of the junction divided by the thickness of the lightly-doped semiconductor is approximately 0.1. In FIG. 1C, $r_j$ is the radius of the junction, and W' is the thickness of the lightly-doped semiconductor. $BV/BV_{pp}$ is the breakdown voltage relative to that of a parallel plane.

The prior art power DMOS and insulated gate bipolar transistor devices typically have spherical or at best cylindrical shaped PN junctions. As indicated above, the spherical junctions typically break down at lower voltage values than do the cylindrical junctions. As also indicated above, a cylindrical junction breaks down at a lower voltage value than does a planar junction.

Thus the prior art power transistor devices as described above typically experience electrical breakdown at the corners of their diffused regions. This electrical breakdown is undesirable, because it can lead to heating at the breakdown region due to excessive current flowing through that spot. This is especially a problem because power transistors are intended to be subjected to high currents, and so this heating can catastrophically destroy the transistor.

It is therefore desirable to have a transistor device for use in power switching which does not break down at the active part of the transistor.

In U.S. Pat. No. 4,779,123, issued Oct. 18, 1988, incorporated herein by reference, Bencuya et al. disclose an improved insulated gate bipolar transistor having a high conductivity collector well surrounding the active portion of the transistor. This collector well prevents undesirable transistor latching. Latching is a phenomenon whereby a semiconductor structure "latches" into a self-perpetuating state of bipolar conduction, which cannot be turned off by removing the voltage bias on the gate to stop FET mode conduction. However, Bencuya et al. do not disclose any method of dealing with the breakdown problem.

SUMMARY OF THE INVENTION

In accordance with the invention, a transistor cell is provided with a voltage clamping region surrounded by the active portion of the transistor cell. The voltage clamping region has a voltage breakdown lower than the voltage breakdown of the remainder of the transistor, thus protecting the transistor from destructive voltage breakdown and hence increasing the transistor's safe operating area (SOA) In accordance with the preferred embodiments of the invention, the transistor is either an insulated gate bipolar transistor (IGBT) or a double diffused metal oxide semiconductor field effect transistor (DMOSFET). Preferably the clamping region has a spherical cross sectional shape so as to achieve a relatively low breakdown voltage.

In accordance with one embodiment of the invention, the clamping region is formed in the center of a substantially annular (ring-shaped) active region of the transistor cell. In one alternative embodiment, multiple clamping regions are provided in each cell, with the multiple clamping regions arranged symmetrically. The gate region of the cell surrounds the clamping region. The active regions of the cell (i.e., the source and body for the DMOSFET or emitter and body for the IGBT) define a closed cell structure surrounding the gate region. In one embodiment of the invention the active region of the transistor includes a graded junction. In accordance with this graded junction embodiment, the clamping region also has a spherical cross sectional shape. These various embodiments of the invention take advantage of the existence of a lower breakdown voltage capability of spherical and cylindrical junctions compared to planar junctions.

In accordance with one embodiment of the invention, the annular shaped active device cell encloses an island semiconductor region which acts as a voltage clamp. Since the active device cell is annular in shape, it has a higher breakdown voltage than would a cylindrical junction. On the other hand, the clamping region has a spherical cross-sectional shape, so breakdown will always occur around the clamping region junction rather than around the active device region junction. As described above, the active device junction can include a graded junction so as to provide an even higher voltage breakdown for the active device junction than for the clamping region.

The clamping region in the case of the DMOSFET preferably forms a high voltage zener diode. As is known in the art, discrete zener diodes are conventionally used because they always break down at a particular voltage and can break down repeatedly without being damaged. Therefore, provision of a zener diode in the substrate in accordance with the invention ensures that the breakdown phenomena occurs in the bulk of the epitaxial layer and protects the active device. In the case of the N-channel IGBT, the clamping region preferably forms a portion of a PNP-bipolar junction transistor.

Both of these embodiments of the invention improve the safe operating area (SOA) of the power transistor, because a zener diode has a superior safe operating area than does a DMOSFET, and similarly a PNP-BJT has a superior safe operating area than does an insulated gate bipolar transistor. Thus for a given voltage, a transistor in accordance with the invention can carry a higher current than does a prior art transistor. The above described embodiments of the invention also beneficially prevent latching for the same reasons as does the transistor disclosed by Bencuya et al. in U.S. Pat. No. 4,779,123 as described above.

BRIEF DESCRIPTION OF THE DRAWINGS

Identical reference numbers in different figures denote similar or identical structures.

DETAILED DESCRIPTION OF THE INVENTION

Figure 1A:
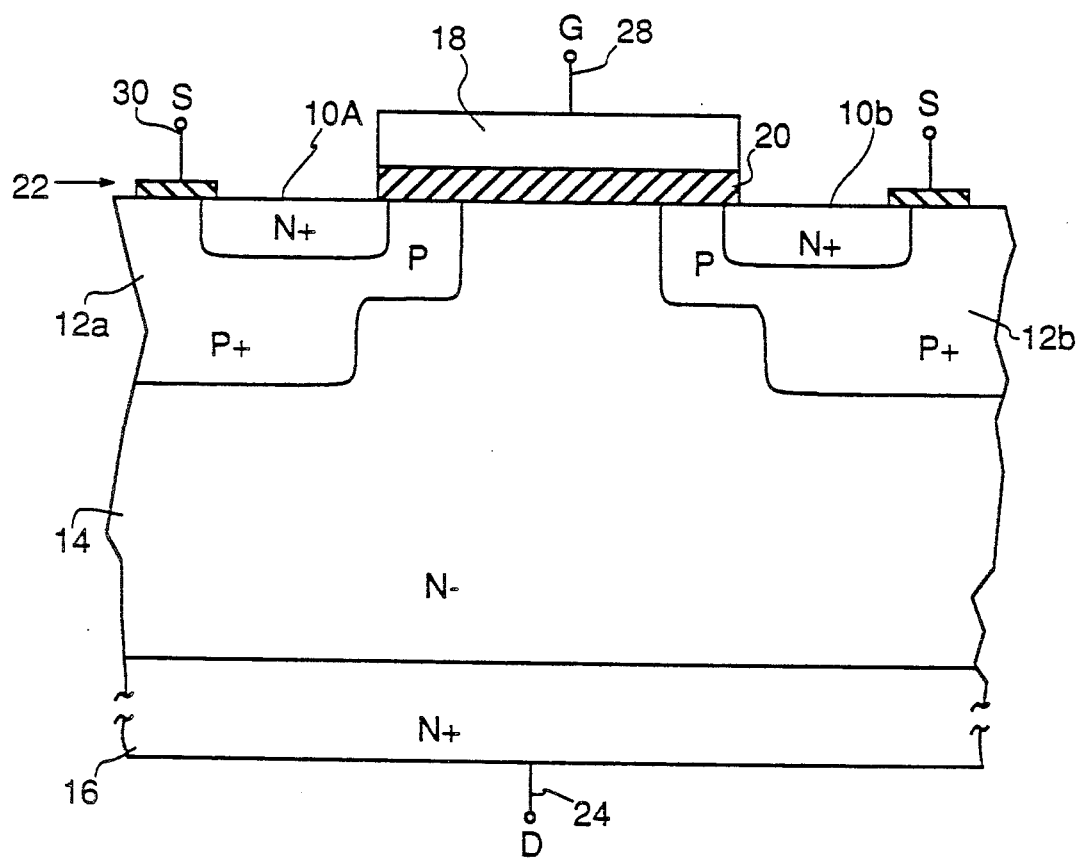
FIGS. 1A and 1B show views of portions of a prior art power transistor.
Figure 1B:
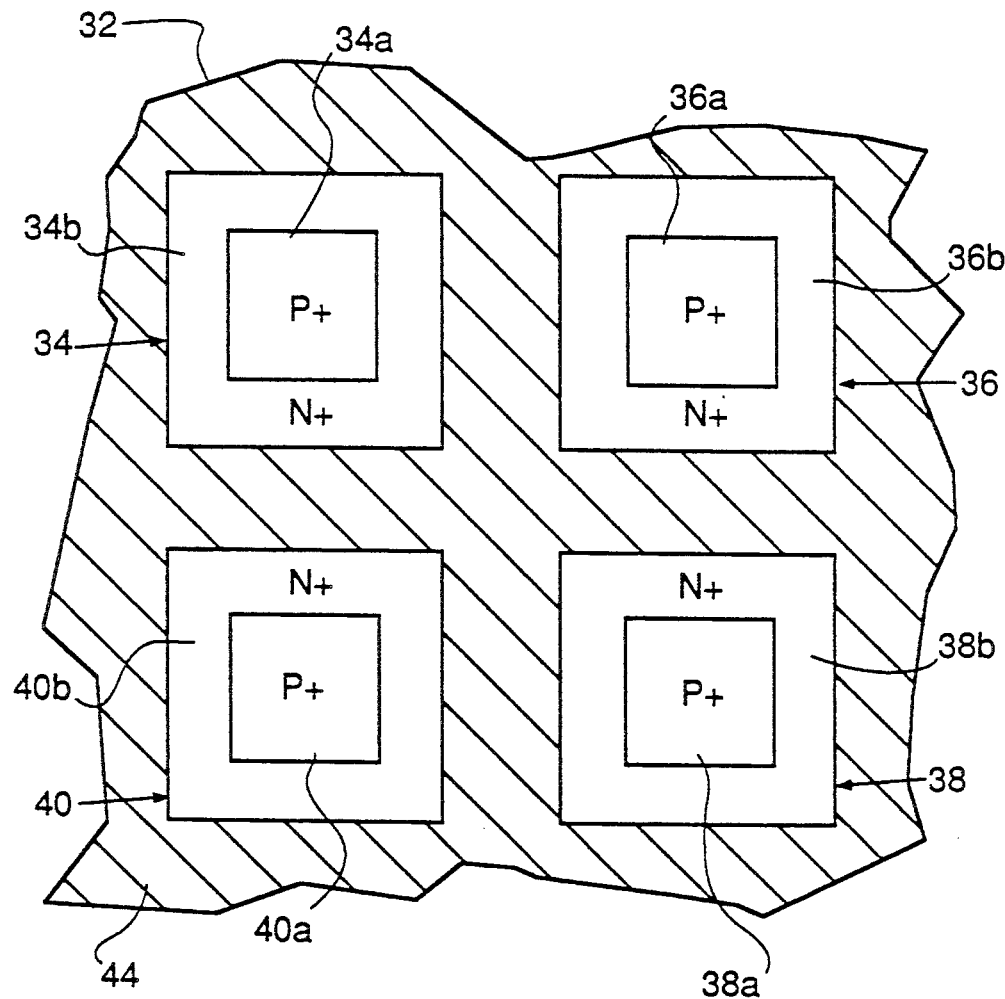
Figure 1C:
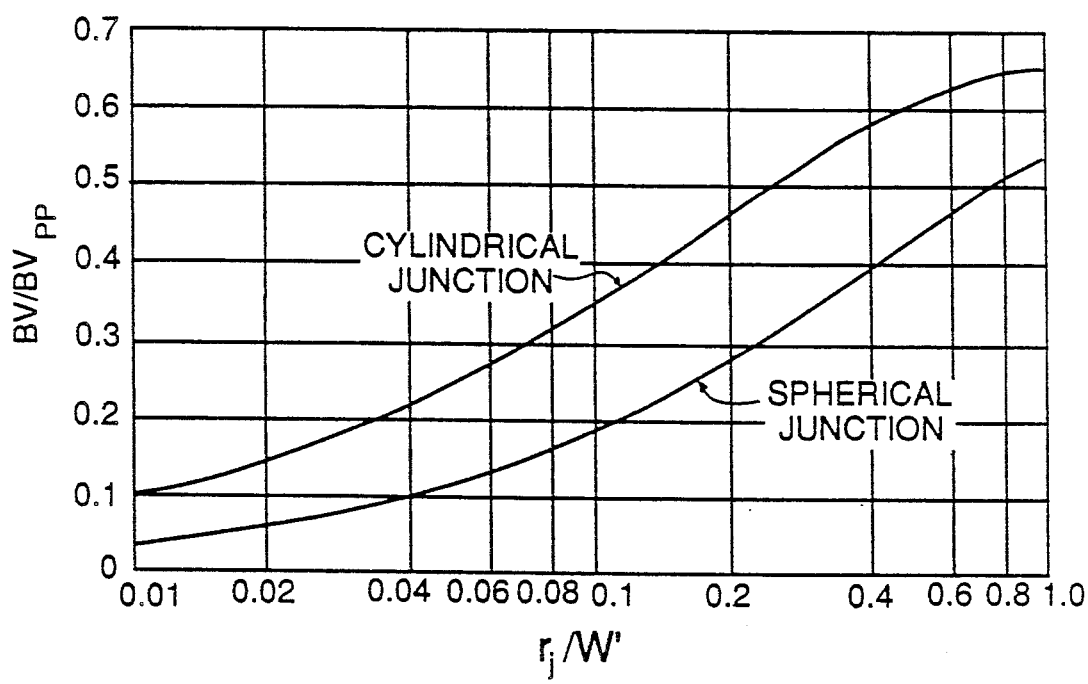
FIG. 1C shows breakdown voltage of a spherical and cylindrical junction.
Figure 2:
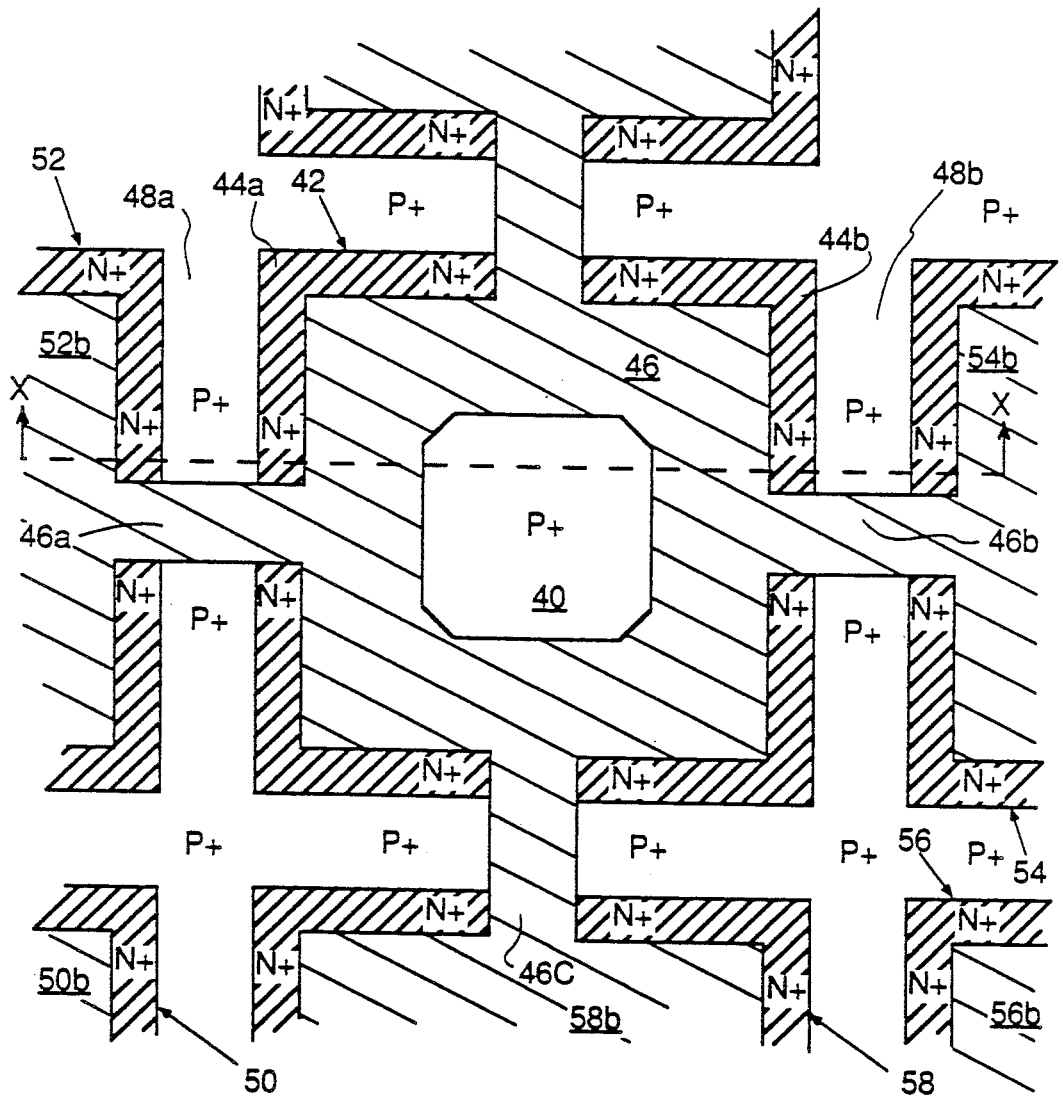
FIG. 2 shows a top view of one embodiment of a transistor cell of the present invention.

FIG. 2 shows a top view of one embodiment of the present invention. FIG. 2 shows only a small portion of the transistor; it is understood that the pattern shown in FIG. 2 is replicated many times for the entire transistor. P+ region 40 is the clamping region which is at the center of a preferably substantially radially symmetric (i.e., square) active cell 42 of the device. The active cell 42 includes the N+ source (for a DMOSFET) or emitter (for an IGBT) region 44a, 44b which in this embodiment is square in shape. The polysilicon gate region 46 for cell 42 is shown. Shown adjacent to the cell 42 are portions of the adjacent cells 50, 52, 54, 56, 58. The polysilicon gate region 46 of cell 42 is connected by polysilicon "bridges" 46a, 46b, 46c (which overlie the body regions 48a, 48b) to respectively the polysilicon gates 52b, 54b, 58b of adjacent cells 52, 54, and 58. Thus the gate region in each cell is ultimately connected by the polysilicon bridges to the gate region in each of the other cells in the transistor. The polysilicon bridges advantageously eliminate the need for a topside contact to each cell's gate region, thus simplifying fabrication and reducing the surface area of each cell. Underneath the polysilicon bridges 46a, 46b, 46c the P+ regions 48a, 48b are continuous and thus cell 42 is fully enclosed.

The top side electrical contacts to the various regions are not shown in this view for simplicity. The clamping region 40 of cell 42 is electrically connected by conventional metallization (not shown) to the source or emitter region 44a, 44b and to body regions 48a, 48b. The cell structure geometry as shown on FIG. 2 is used for both DMOS and IGBT transistors in accordance with the invention. These two types of transistors would therefore have the same appearance in a top view as shown in FIG. 2.

Figure 3A:
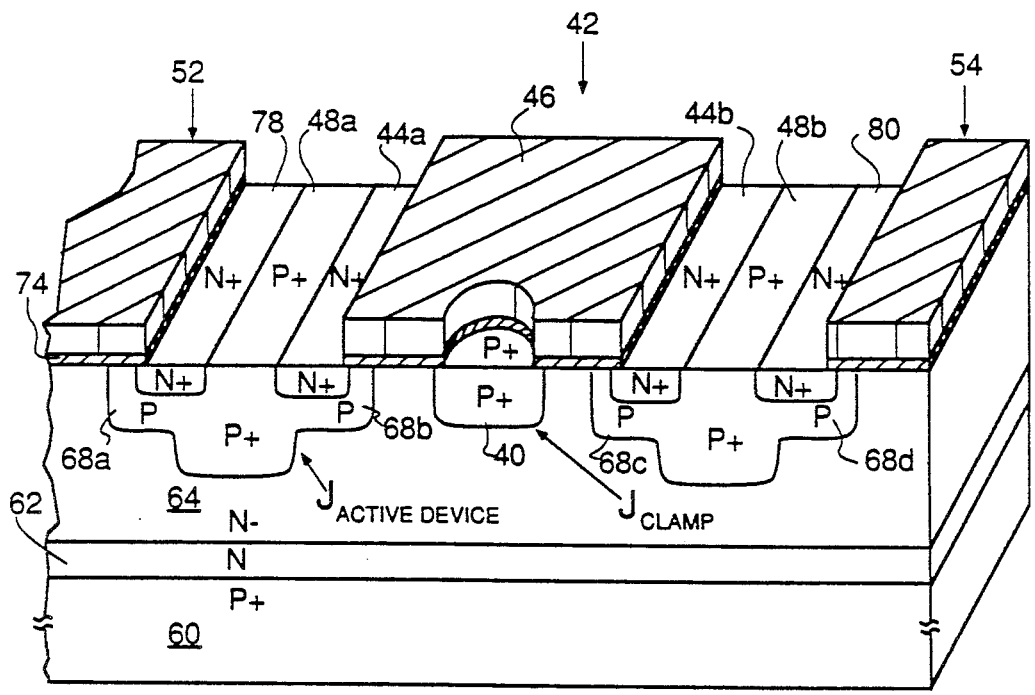
FIGS. 3A and 3B show two embodiments of the present invention.

FIG. 3A shows a cross section of an insulated gate bipolar transistor in accordance with the invention. The view of FIG. 3A is taken through the line X—X in FIG. 2. Shown in FIG. 3A is the P+ type substrate 60. Overlying the substrate region 60 is N type region 62. Overlying the N type region 62 is an N— type epitaxial layer 64 which is the base region. The active device is formed in the N— type region 64. The active device as shown includes the conventional P+ type deep body regions 48a, 48b flanked by P type body regions 68a, 68b, 68c, 68d. It is understood that regions 48a, 48b are actually one region joined outside the plane of the drawing to form an annular structure. N+ type emitter region 44a is formed in P type body region 68a. N+ type emitter region 44b is formed in P type body region 68b. In the center of the active part of the device is the P+ clamping region 40. Overlying the N— type base region 64 is an insulating oxide layer 74. Conductive gate layer 46 overlies insulating oxide layer 74. As shown, the oxide layer 74 and gate layer 46 are opened to provide contacts to the N+ type emitter 44a, 44b and P+ type deep body regions 48a, 48b and to the P+ type clamping region 40. Also shown are N+ emitter regions 78, 80 which are respectively part of adjoining cells 52, 54.

Figure 3B:
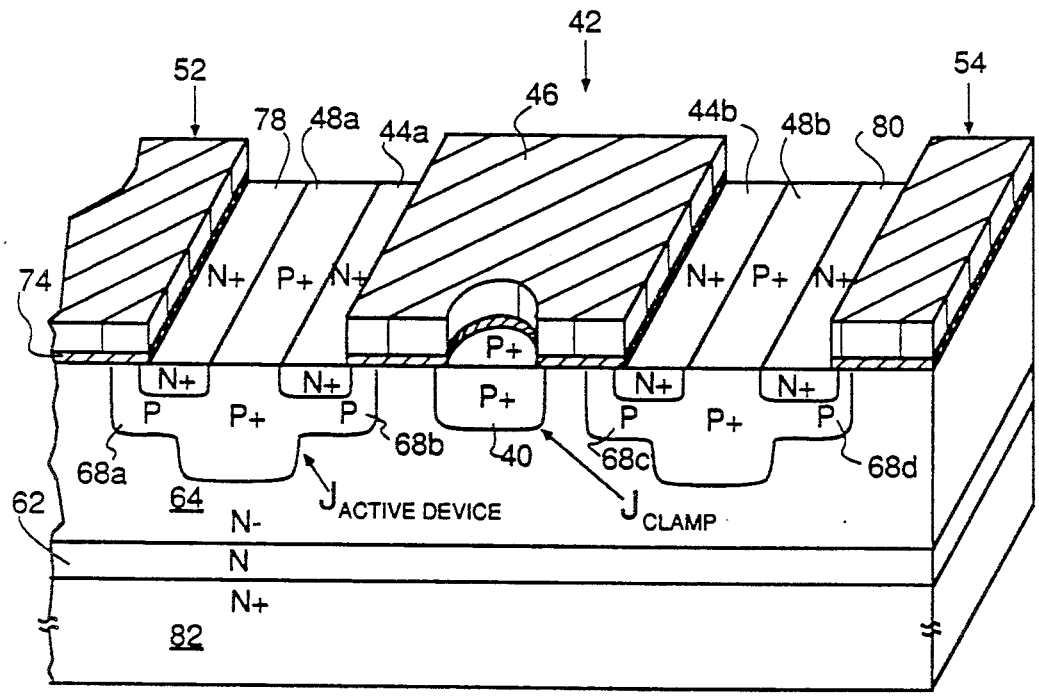

FIG. 3B shows a similar device as shown in FIG. 3 except that FIG. 3B shows a DMOS device. The structural difference between the DMOS device of FIG. 3B and the IGBT of FIG. 3A is that in the DMOS device the substrate layer 82 is an N+ type region.

For the IGBT (of FIG. 3A) the emitter electrical contacts (not shown) conventionally contact the P+ type deep body regions 48a, 48b and the N+ type emitter regions 44a, 44b. The gate layer 46 is electrically contacted by the polysilicon bridges (not appearing in this view) as described above. A collector contact (not shown) is conventionally provided at the back side of the device in contact with the P+ type substrate region 60. As shown, the base region 64 is a conventional floating (or open base) which does not have its own electrical contacts. The electrical contacts for the DMOS devices are identical to those for the IGBT device.

For both the IGBT and DMOS devices as shown in respectively FIGS. 3A and 3B, all of the conductivity types of the regions may be reversed. Thus in the reversed version of the IGBT device, the base region (epitaxial layer) is P type, the collector region is N+ type, and the emitter region is P+ type. For the reversed polarity version of the DMOS device, the drain region is a P— type region. Thus the reversed polarity version of the DMOS device is a P channel DMOSFET device instead of the N channel (i.e., channel region 64) device shown in FIG. 3B.

As shown in FIG. 2, the active device cell 42 is delineated by the N+ type regions 44a, 44b which enclose a P+ type island 40 which is the voltage clamp region. Since the active device cell 42 is preferably annular in shape in the plane defined by the principal surface of the substrate, the active device cell (i.e., regions 68a, 68b, 68c of FIG. 3A) has a higher breakdown voltage than would a cylindrical junction. Since the clamping P+ type region 40 preferably has a spherical shape in cross section as shown in FIGS. 3A and 3B, the breakdown of the device will always occur around the P+ type clamp junction region 40 rather than at the active device cell region 42.

For the IGBT version of the device as shown in FIG. 3A, the P+ type clamping region together with the N-type region 64 and the P+ type substrate 60 form a PNP bipolar junction transistor. Thus the safe operating area (SOA) of the device is improved because a PNP-bipolar junction transistor has a larger safe operating area than does an ordinary prior art insulated gate bipolar transistor.

For the DMOS embodiment of the invention shown in FIG. 3B, a zener diode which breaks down at high voltage is formed by the junction between P+ type clamping region 40 and the N— type region 64 in which the P+ type clamping region 40 is formed. This PN junction high voltage zener diode improves the safe operating area (SOA) of the device.

With reference to the safe operating area, in accordance with the invention the provision of a breakdown device (a zener diode or transistor) by means of a clamping region provides the benefit of allowing the device including the clamping region to break down at a much lower voltage. Thus even though a particular current is still passing through the device, the clamping region will break down at a a voltage lower than that at which the active portion of the device will break down, and so the clamping region will carry most of the current which thus bypasses the active device area. Thus, the normal operation of the device will still be within the safe operating area current curve.

Figure 4:
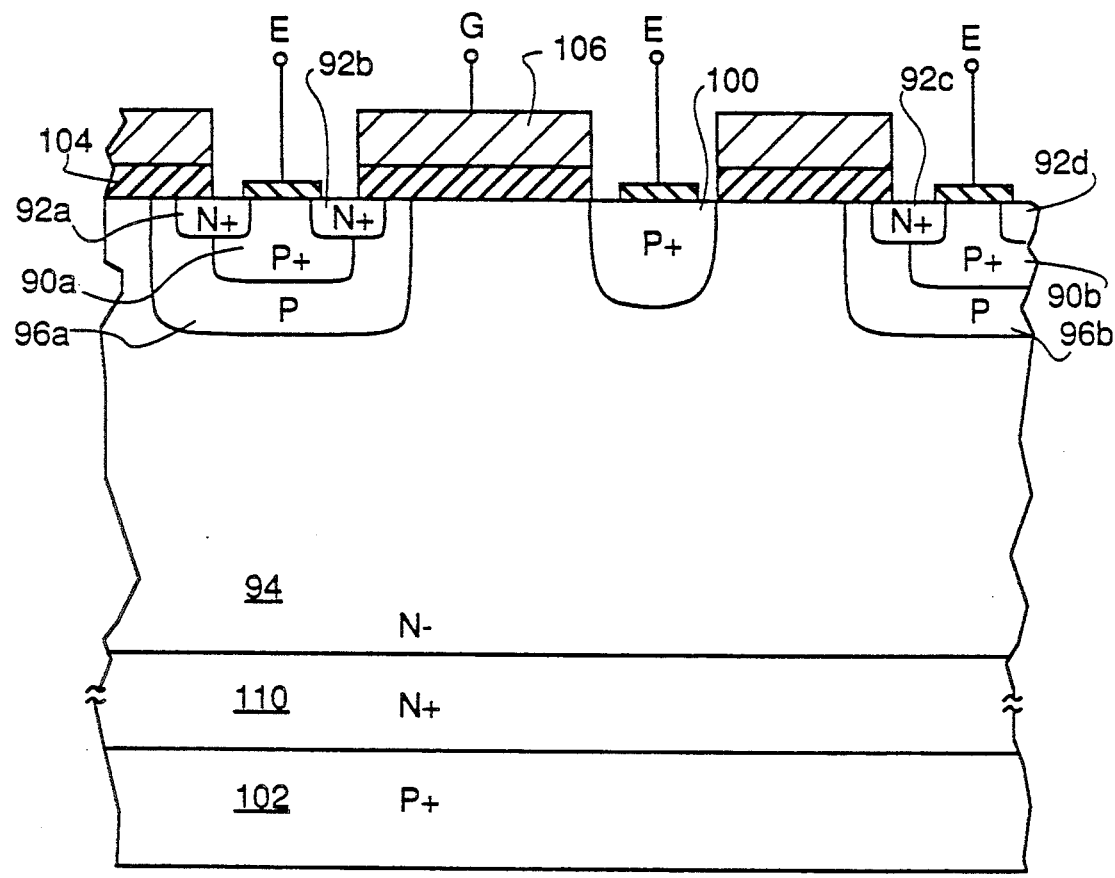
FIG. 4 shows a cross section of another embodiment of the present invention.

Another embodiment of the invention is shown in FIG. 4 in cross section. In this embodiment showing an IGBT, the active region of the device is fabricated so as to have a graded junction between the P+ regions 90a, 90b in which the N+ type emitter regions 92a, 92b, 92c, 92d are formed and the surrounding N- type region 94. The P+ type body regions 90a, 90b are located respectively in P type wells 96a, 96b. Hence the denomination known in the art of "graded junction" due to the graded (not shallow or sharp) doping profile. The graded P-N junction advantageously has a higher (by 25 to 100 volts) breakdown voltage than does an abrupt (i.e., not graded) P-N junction. Also included in this embodiment of the device is a P+ type clamping region 100 connected electrically to the emitter regions 92a, 92b, 92c, 92d. Also provided are insulating layer 104, gate conductive layer 106, and intermediate N layer 110. The device shown in FIG. 4 is an insulated gate bipolar transistor because the substrate 102 is of opposite conductivity type to the base region 94. If the substrate 102 is N+ type and all other regions the same as in FIG. 4, this device would be a DMOS field effect transistor cell. The P+ type clamping region 100 has the same effect as does the P+ type clamping region in the device shown in FIGS. 3A and 3B.

For the embodiment of the device shown in FIG. 4, the shape of the clamping P+ type region 100 is preferably spherical. The P+ clamping region 100 in the embodiment of the invention shown in FIG. 4 is preferably an abrupt junction. An abrupt junction, as is known in the art, is typically obtained in alloyed and shallow diffused structures. Often one side (i.e., the P+ clamping region 100 side) of an abrupt junction is heavily doped.

In accordance with the invention, the shape of the active area cells 42, 50, 52, 54, 56 and 58 as shown in FIG. 2 need not be square in the top view. Preferably the shape of each of the cells is approximately radially symmetric, i.e., a circle, square, hexagon, octagon or similar shape.

An advantage of radial symmetry is increasing the active cell breakdown voltage by using the third dimension, that is the thickness of the semiconductor material, to ensure that depletion takes place uniformly.

Figure 5:
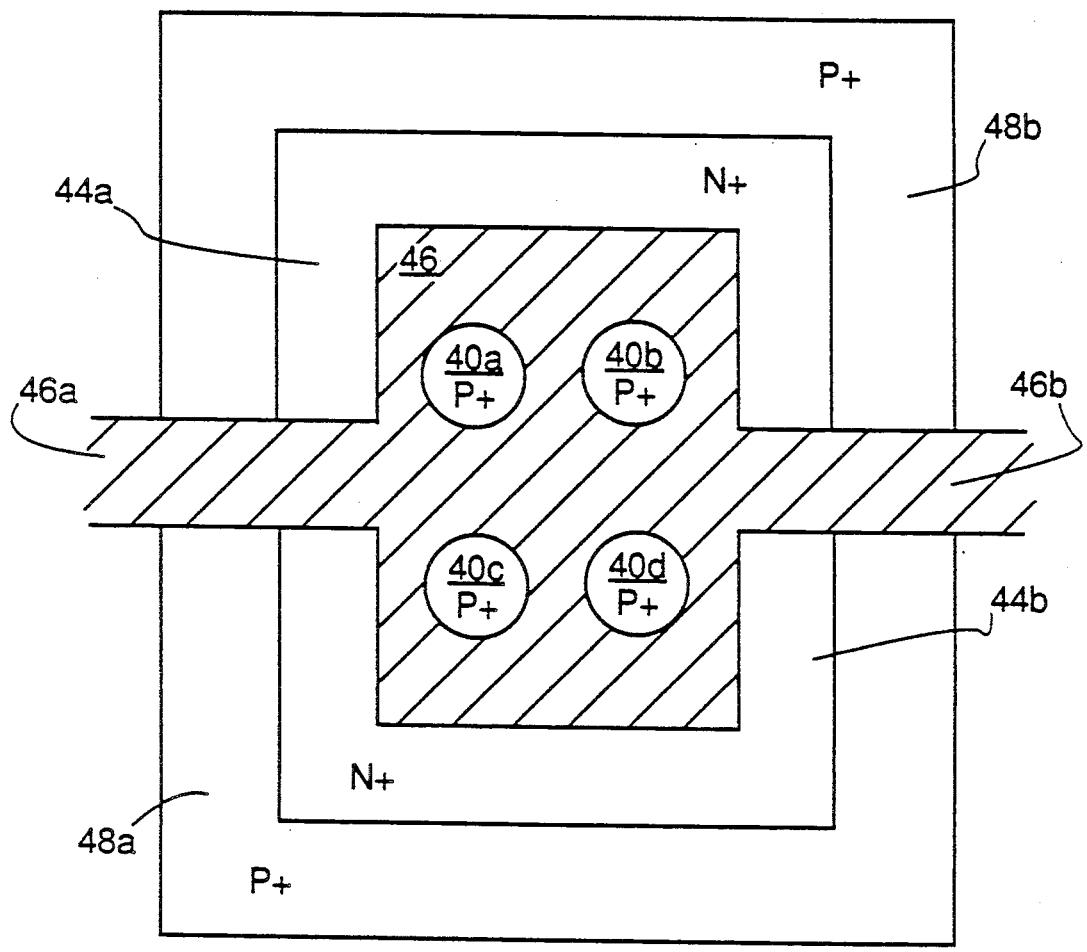
FIG. 5 shows a top view of another embodiment of the present invention.

If the cells are not contiguous, i.e., as with circular cells, the area between the cells is preferably a "dead" (inactive) region having the same doping as the outer (i.e., body) region of each cell. In another embodiment, the cells are square, circular, or are elongated closed rectangles each enclosing a gate region, and multiple clamping regions are provided in the gate region between the two channel regions of each rectangle. A transistor cell in accordance with this embodiment is shown in top view in FIG. 5, and has a similar structure to that shown in FIG. 2, except that multiple P+ clamping regions 40a, 40b, 40c, 40d are provided in gate region 46, and only two bridges 46a, 46b are provided. N+ regions 44a, 44b and P+ body regions 48a, 48b enclose the cell, which is an elongated rectangle in shape.

Figure 6:
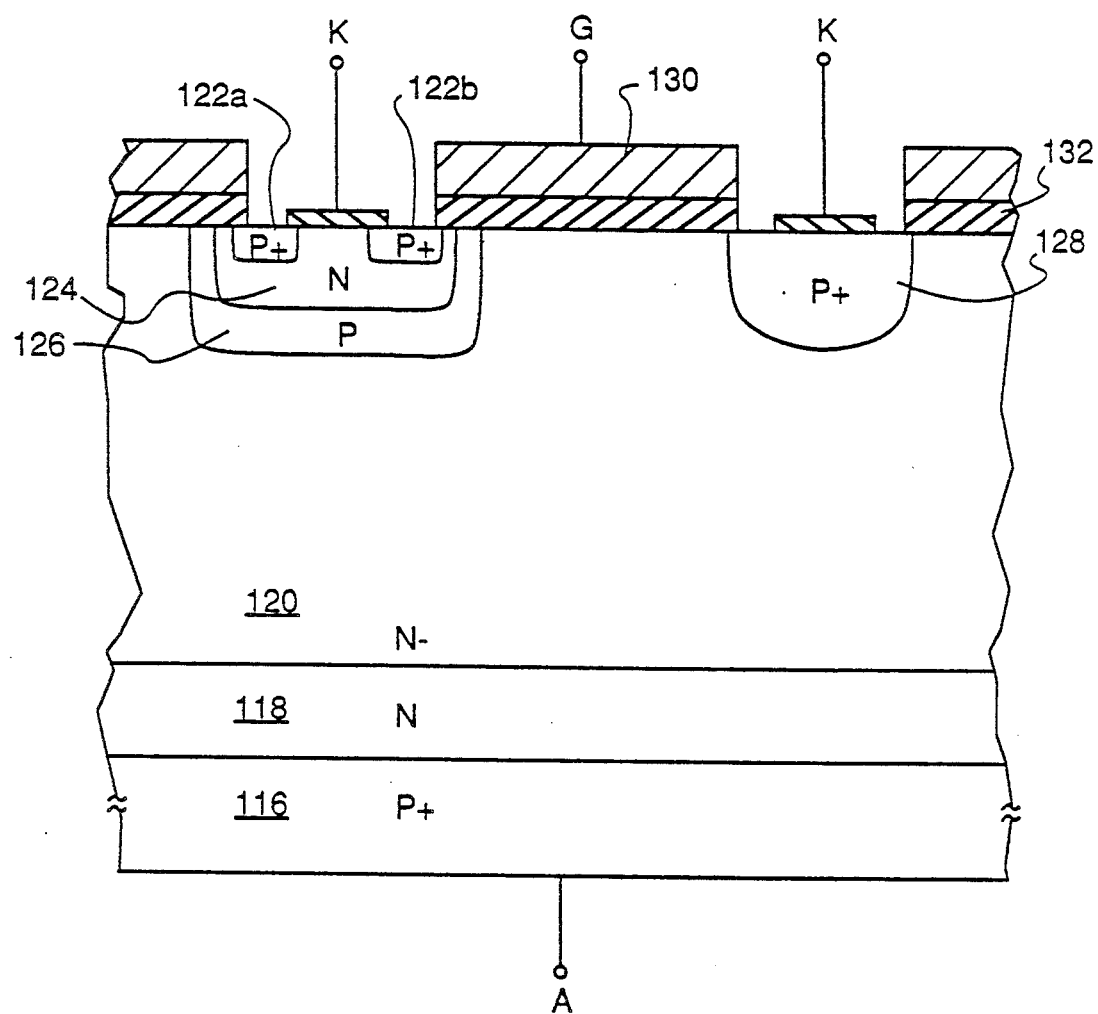
FIG. 6 shows a cross section of another embodiment of the invention.

In another embodiment of the invention, a MOS (metal oxide semiconductor) controlled thyristor (MCT) is provided with a voltage clamping region to increase its breakdown voltage. As shown in FIG. 6 in cross section, the MCT includes P+ type substrate 116, intermediate N type region 118, and N− type epitaxial layer 120. P+ type cathode (K) regions 122a, 122b are formed in N type region 124, which is in P type well 126. P+ type clamping region 128 is connected electrically to the cathode regions 122a, 122b. A conductive gate region 130 is provided overlying gate insulating layer 132, with gate terminal G. Anode terminal A is provided on substrate 116.

In one embodiment of the invention, the transistor is for use at a 600 volt typical ordinary operating level. Such a device rated at 600 volts typically would have an actual breakdown in excess of 700 volts to provide a safe operating margin. The typical dimensions for one cell for such a device are described hereinafter with reference to FIG. 2. The spacing between the P+ type diffusions 40 and 44b, that is the width of the cell 42, is typically 15 microns to 20 microns. This spacing is an edge of the voltage clamp region 40 to the nearest edge of the N+ type regions 44a or 44b. This distance is the spacing when the P+ type diffusions are masked during fabrication. The actual spacing when the device is completed will typically be less due to the lateral diffusion effect when the device is fabricated.

The typical width of the P+ type clamping region 40 is about 10 microns. This width is defined to accommodate a minimum sized electrical contact to the P+ type clamping region 40. The width of the cell 42 is typically about 30 to 40 microns. This includes the N+ type region 44a, the gate region 46, the P+ type region 40 and the other N+ type region 44b as defined when the diffusions are masked. In other embodiments which use for instance circular, or hexagonal shaped cells, the dimensions are preferably approximately the same. The polysilicon bridges 46a, 46b, 46c are each preferably about 7 microns wide (i.e., the dimension of bridge 46a in a direction perpendicular to line X—X). n a typical power transistor device there are approximately 10,000 such cells 42 to switch a current of about 50 amps.

Figure 7:
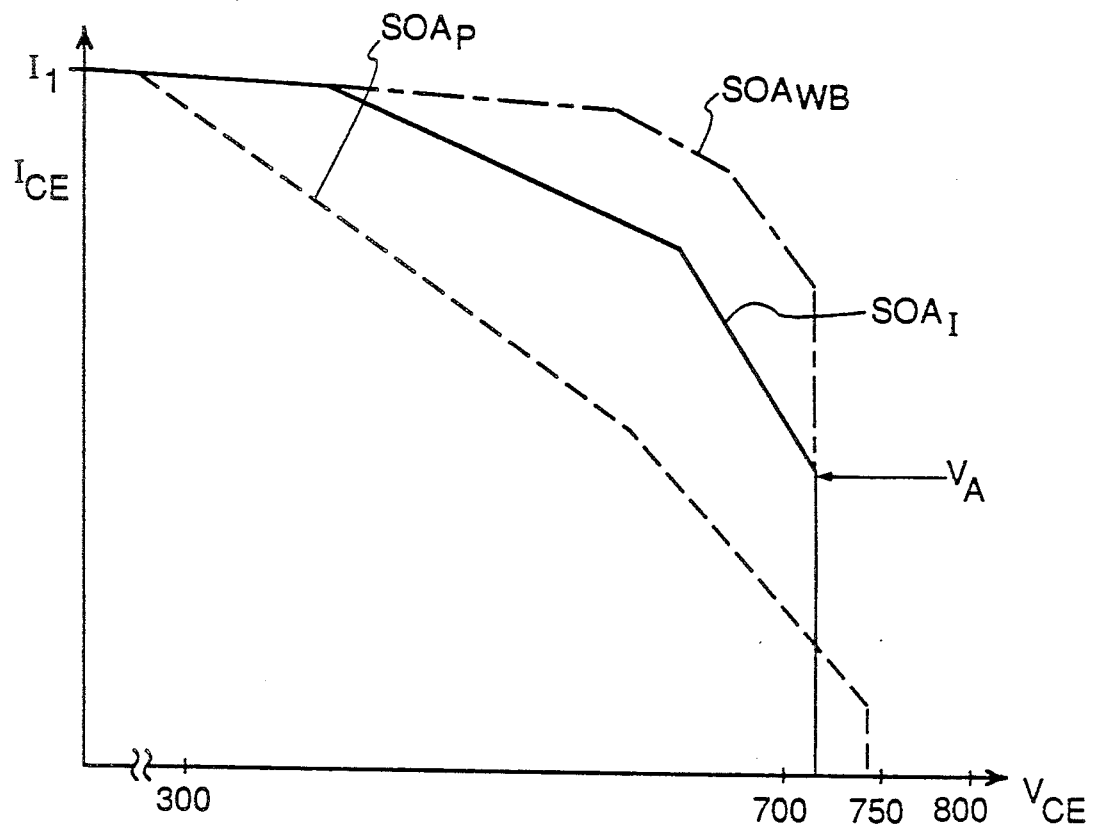
FIG. 7 shows the safe operating area curve for one embodiment of the present invention.

The safe operating area curve for the above described IGBT device is as shown in FIG. 7 which shows collector-emitter current $I_{CE}$ plotted against collector-emitter voltage $V_{CE}$ The maximum current is at $I_t$. The $SOA_I$ of the IGBT embodiment of the present invention (solid line) lies within the $SOA_{WB}$ of a prior art wide base PNP transistor. The $SOA_I$ of the present invention is generally superior, as shown, to the $SOA_P$ of a prior art IGBT (dotted line). As shown, the breakdown voltage of one embodiment of the present invention is at about 750 volts, which corresponds to the avalanche voltage $V_A$ of a prior art wide base PNP transistor. A wide base PNP transistor has an $SOA_{WB}$ (interrupted line) approaching the ideal; however, such a structure as is well known is not suitable for a power transistor. The SOA for the transistor cell in accordance with the IGBT embodiment of the present invention is effectively a combination of the SOA of a bipolar transistor and the SOA of the active device of each cell.

Figure 8A:
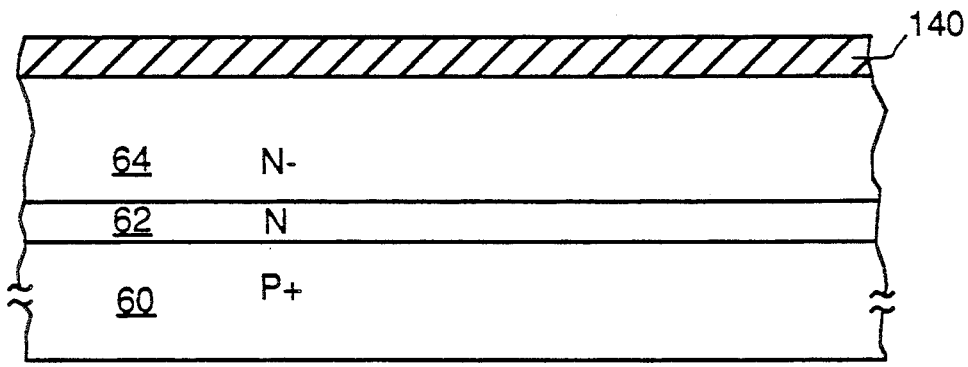
FIGS. 8a-8f show process steps to fabricate one embodiment of the invention.

The transistor in accordance with the invention is formed by conventional masking, implantation, and diffusing processes as is known in the art. The process steps in accordance with the invention in the preferred embodiment are as follows for the IGBT device shown in FIG. 3A. Substrate 60 (see FIG. 8a) is preferably silicon having a conductivity of about 0.005 to 0 .01 Ω-cm and a <100> crystal orientation, but semiconductor materials other than silicon having other conductance, conductivity type, and crystal orientation are also appropriate.

Subtrate P+ type region 60 is conventionally doped to a level of about $5 \times 10^{18}$ ions per cm$^3$. For the IGBT embodiment of the invention, the P+ doping is achieved using boron. For the DMOS embodiment of the invention, the substrate N+ doping level is preferably approximately $10^{19}$ ions per cm$^3$ and is achieved using arsenic or phosphorus. The N type region 62 is then grown epitaxially to approximately 5–10 microns thick and provided with a arsenic or phosphorus doping of about $1 \times 10^{16}$ to $5 \times 10^{17}$ atoms per cm$^3$. Grown conventionally on top of the N type region is the N− type epitaxial layer 64, which is grown to approximately 60 microns thick. The doping level of the epitaxial layer 64 is about $1 \times 10^{14}$ per cm$^3$. Field oxide layer 140 is conventionally grown over epitaxial layer 69.

Figure 8B:
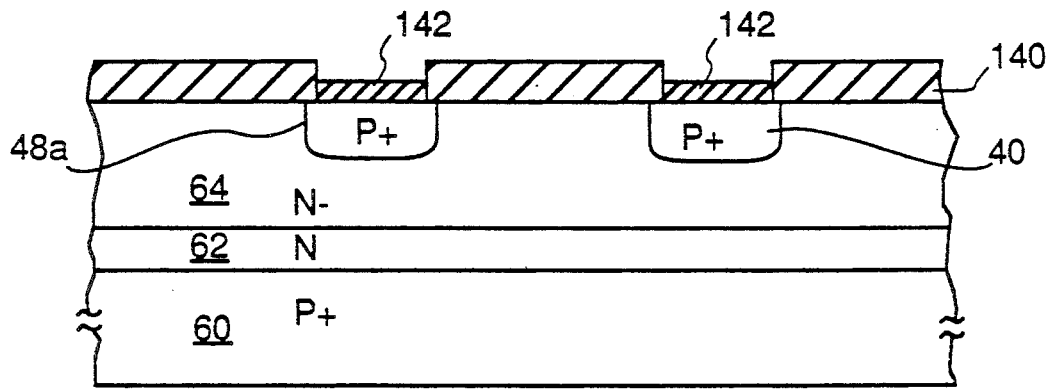

As shown in FIG. 8b, by means of a first mask the field oxide layer 140 is conventionally patterned using photoresist. In areas exposed by the mask, field oxide 140 is removed to form openings for passage of impurities for formation of P+ regions 48a, 40.

P+ type deep body region 48a and clamping region 40 are conventionally formed, preferably in one step. This is done preferably by subjecting the wafer to an ion implantation process using boron, a dosage of about $10^{16}$ ions per cm$^2$, and an implant energy of about 120 KeV. Alternatively, regions 48a, 40 are formed by a boron nitride injection which is used as a P+ diffusion source. The wafer is then subjected to a diffusing process. Regions 48a and 40 preferably are each about 3 to 6 microns deep and have a doping level of about $5 \times 10^{19}$ to $10^{20}$ atoms/cm$^3$. Then a layer of silicon dioxide 142 about 500 nm in thickness is regrown over the openings in field oxide layer 140.

Figure 8C:
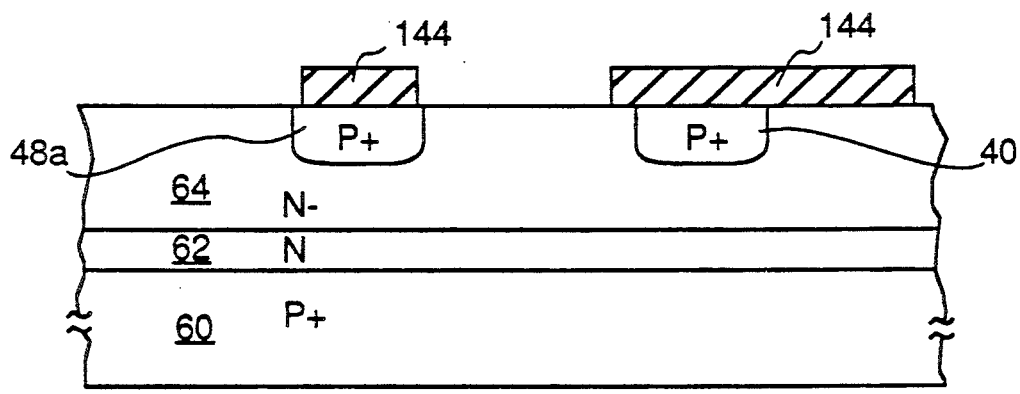

Then as shown in FIG. 8c, a second mask is used to conventionally pattern and remove portions of field oxide 140 and regrown oxide 142, leaving portions 144 of the two combined oxide layers 140, 142 over P+ regions 48a, 40, and also over the high voltage termination regions at the edge (not shown) of each die of the wafer.

Figure 8D:
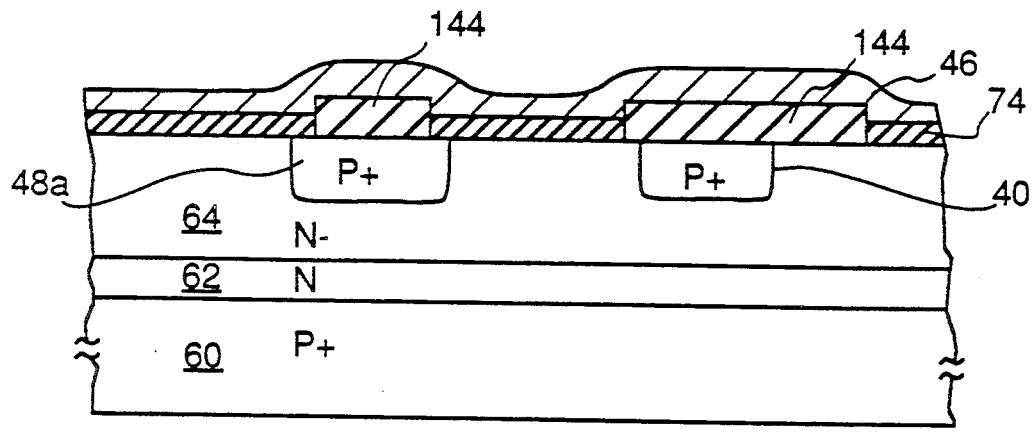

Silicon dioxide layer 74 (see FIG. 8d) is formed on epitaxial layer 64. Silicon dioxide layer 74 is thermally grown to a thickness of about 100 nm and serves as the gate insulating layer. Polycrystalline silicon layer 46 is the gate layer and is formed over silicon dioxide layer 74 typically by chemical vapor deposition, to a thickness of about 500 nm. Other conductive materials can be used as the gate layer.

Figure 8E:
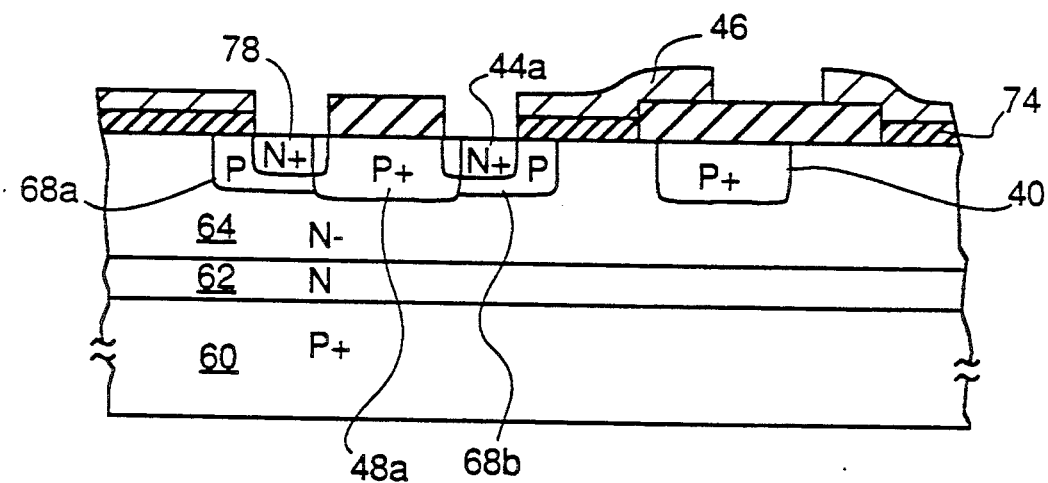
Figure 8F:
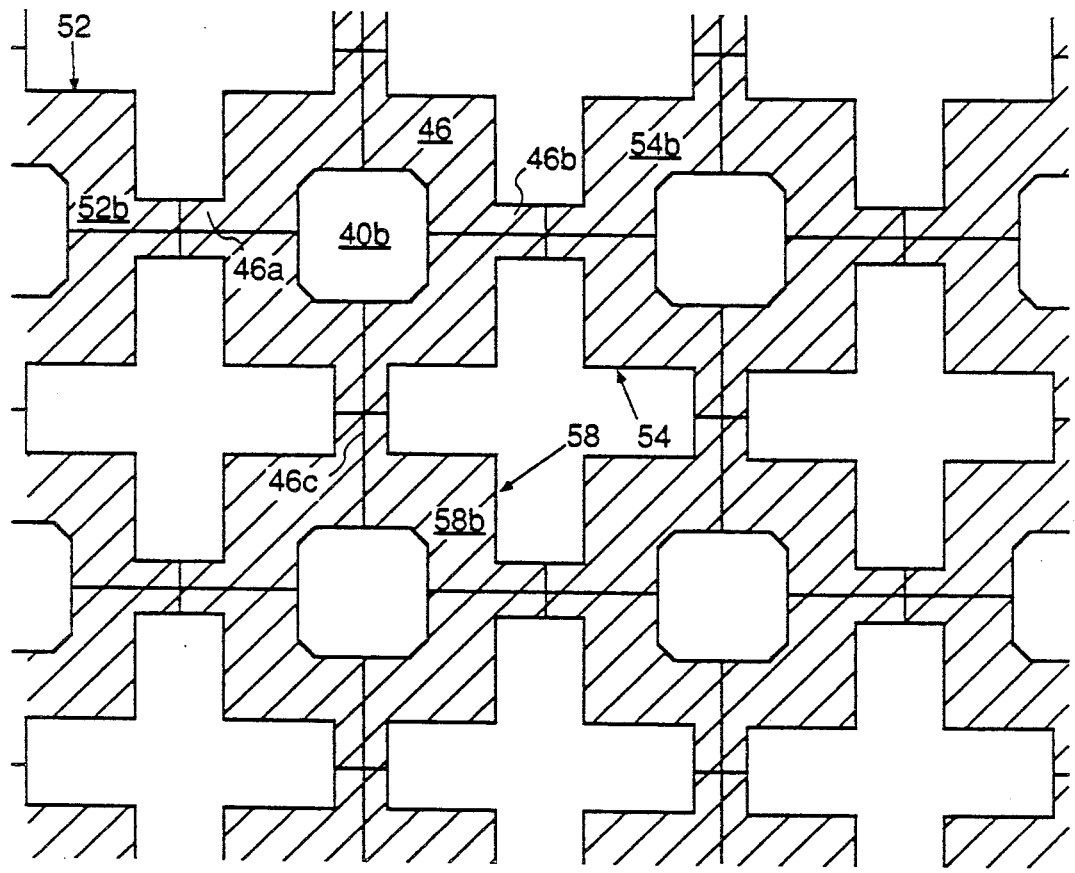

Silicon dioxide layer 74 and polycrystalline silicon layer 46 are then conventionally patterned (see FIG. 8e) using a photoresist layer and a third mask (not shown). Then the exposed portions of gate layer 46, and the portions of sililon dioxide layer 74 lying thereunder are removed. FIG. 8f shows the configuration of a portion of the polysilicon gate layer 46 after patterning in a top view, showing polysilicon gate layer "bridges" 46a, 46b, and 46c respectively to adjacent gate regions 52b, 54b, and 58b of respectively cells 52, 54, and 58, as discussed above in connection with FIG. 2. FIG. 8f illustrates the repetitive pattern of polysilicon gate layer 46 after it is patterned. The opening 40b in gate layer 46 is for electrical contact to clamping region 40 in the underlying epitaxial layer (not shown).

P type body regions 68a, 68b, (see FIG. 8e) are formed conventionally by ion implantation using polycrystalline silicon layer 46 as a mask. In one embodiment, dopants such as boron or aluminum are implanted into the wafer with a dosage of about $10^{14}$ per cm$^2$ and an implant energy of about 40 to 100 KeV. The wafer is then subject a diffusion process so that regions 68a, 68b, are each about 3 to 4 microns deep and have a surface doping level of about $1 \times 10^{17}$ to $10^{18}$ ions per cm$^3$. A thin silicon dioxide layer (not shown) is thermally grown over the entire wafer surface to a thickness of about 200 nm during the diffusion process.

The N+ type source regions 78, 44a, are then conventionally formed preferably by ion implantation using arsenic or phosphorus at a dosage of about $8 \times 10^{15}$ per cm$^2$ and an implant energy of about 60 KeV. The wafer is then subjected to a diffusion process. The N+ type regions 78, 44a, each preferably are less than one micron deep and have a doping level of about $5 \times 10^{19}$ to $10^{20}$ ions per cm$^3$. Thus polysilicon layer 46 serves as the mask for both the P type body regions 68a, 68b and N+ type source regions 78, 44a.

Then a fourth mask (not shown) is used to form an N+ type body region block implant (not shown) at the edge of each die only. This block implant prevents the P type body regions from going into the high voltage termination region at the die edge.

Then conventionally an insulating layer of PSG Or BPSG or silicon dioxide or silicon nitride (nor shown) is formed over the surface of the transistor. This insulating layer is conventionally patterned using a fifth mask, to open contacts to the polysilicon layer 46 and to the various semiconductor regions at the principal surface of the epitaxial layer 64.

A layer of conductive material such as aluminum (not shown) is then formed over the wafer and conventionally patterned by a sixth mask (not shown) to provide electrical contacts to the emitter/body regions, the gate layer, and the clamping region. A second layer of conductive material (not shown) is conventionally formed on the backside of the wafer to electrically contact the substrate 60. A passivation layer is then conventionally formed (not shown) and openings conventionally formed through the passivation layer by a seventh mask for the bonding pads.

The above description of the fabrication of the transistor is illustrative and not limiting. Other embodiments of the invention will have other process parameters. The fabrication of power transistors is well-known in the art and is described in texts such as *Semiconductor Power Devices* by Sorab Gandhi, John Wiley & Sons, 1977, and *Modern Semiconductor Fabrication Technology*, Peter Gise and Richard Blanchard, Prentice-Hall, 1986.

In accordance with the embodiment of the invention shown in FIG. 4 with the graded junction, the P+ type clamping region 100 is preferably formed in a different process step than is the graded junction. This is because the graded junction has a different depth of the diffused region than does the clamping region 100. The P-N graded junction is formed by driving a lightly doped P type region 96a, 96b deeper into the surrounding N− type region 94 than is the shallower P+ region 90a, 90b. This driving takes a longer diffusion time. Formation of P type region 96a, 96b is done by means of an additional mask before the first masking step described above.

The intermediate N type layer region 62 shown in both FIGS. 3A and 3B and 4 advantageously stops semiconductor depletion to that point and prevents undesirable punch through from the P+ type body region to the top of the substrate layer 60. The device would function therefore in an alternative embodiment without the N type layer region 62. The epitaxial N− type layer 64 would in this case preferably be almost double the thickness compared to a transistor with the N− type layer 62, 110 included. The N type region 62, 110 thus provides the benefit of a thinner epitaxial layer. Note that as is known in the art, depletion starts from the top and extends from the surface towards the substrate. If the N− type layer region 62, 110 is removed, then depletion tends to reach through to the P+ type substrate region 60 of FIG. 3A. This may disadvantageousy cause injection from the substrate P+ type region 60 in the IGBT device of FIG. 3A, which will therefore undesirbly cause a low breakdown voltage.

In other embodiments of the device, the invention is applicable to high voltage integrated circuits as well as to discrete power transistors as described above. In the high voltage integrated circuit, the active portion of each cell is preferably protected through a zener diode clamp in accordance with the invention.

The above description of the device is illustrative and not limiting. Other embodiments of the invention will be apparent in light of the invention to one of ordinary skill in the art.

We claim:

1. A transistor comprising a plurality of cells wherein each cell comprises:

a semiconductor body of a first conductivity type;

a substantially annular first region of a second conductivity type formed in the semiconductor body and surrounding a portion of the semiconductor body at a principal surface of the semiconductor body;

a second region of the first conductivity type formed in the annular region;

a conductive gate region overlying the principal surface of the semiconductor body and having its extent defined by the surrounded portion of the semiconductor body; and a clamping region of the second conductivity type formed in the surrounded portion of the semiconductor body, and having a voltage breakdown lower than a voltage breakdown of a the annular first region and second region, wherein the clamping region has a cross-sectional shape differing from that of the annular firs region and a depth and doping level the same as that of the annular first region.

2. The device of claim 1 wherein the annular first region and the second region are substantially square in shape in plane defined by the principal surface of the semiconductor body.

3. The device of claim 1 wherein the clamping region is of a spherical shape in a plane perpendicular to a plane defined by the principal surface of the semiconductor body.

4. The device of claim 1 wherein the annular first region and the semiconductor body form a graded junction.

5. The device of claim 1 wherein the transistor further comprises a substrate of the second conductivity type underlying the semiconductor body, and the clamping region, substrate, and semiconductor body form a bipolar junction transistor.

6. The device of claim 1 wherein the transistor further comprises a substrate of the first conductivity type underlying the semiconductor body, and the clamping region and semiconductor body form a zener diode.

7. The device of claim 1, further comprising a portion of the conductive gate region being the conductive gate region of an adjacent cell.

8. The device of claim 7, wherein the conductive gate region of a first cell comprises a layer of polycrystalline silicon connected to the conductive gate region of at least one adjoining cell by an extension of the layer of polycrystalline silicon.

9. The device of claim 1 wherein the annular first region forms a graded junction with the semiconductor body.

10. An insulated gate bipolar transistor comprising a plurality of cells, wherein each cell comprises:
a substrate having a first conductivity type;
a first region of a second conductivity type overlying the substrate;
a substantially annular second region of the first conductivity type formed in the first region and surrounding a portion of the first region at a principal surface thereof;
at least one third region having the second conductivity type formed in the annular region;
a conductive gate region overlying the surrounded portion of the first region; and
a fourth region of the first conductivity type formed in the surrounded portion of the first region wherein the fourth region is a clamping region, and wherein the fourth region has a cross-sectional shape differing from that of the annular second region and a depth and a doping level the same as that of the annular second region, and wherein the fourth region, first region, and substrate form a bipolar junction transistor.

11. The device of claim 10, further comprising a region of the second conductivity type formed between the substrate and the first region and having a higher concentration of charges than does the first region.

12. The device of claim 10 wherein the annular second region forms a graded junction with the first region.

13. A DMOS transistor comprising a plurality of cells, wherein each cell comprises:
a substrate having a first conductivity type;
a first region of the first conductivity type overlying the substrate;
an annular second region of a second conductivity type formed in the first region and surrounding a portion of the first region at a principal surface thereof;
at least one second region having the first conductivity type formed in the annular region;
a conductive gate region overlying the surrounded portion of the first region; and
a third region of the second conductivity type formed in the surrounded portion of the first region, wherein the third region is a clamping region, and wherein the third region has a cross-sectional shape differing from that of the annular second region and a depth and a doping level the same as that of the annular second region.

14. The device of claim 12, further comprising a region of the second conductivity type formed between the substrate and the first region and having a higher concentration of charges than does the first region.

15. The device of claim 13, further comprising a region of the first conductivity type formed between the substrate and the first region and having a higher concentration of charges than does the first region.

16. A transistor comprising a plurality of cells wherein each cell comprises:
a semiconductor body of a first conductivity type;
a substantially annular first region of the first conductivity type formed in the semiconductor body and surrounding a portion of the semiconductor body at a principal surface of the semiconductor body;
a substantially annular second region of a second conductivity type formed in the semiconductor body and surrounding the annular first region;
a conductive gate region overlying the principal surface of the semiconductor body and having its extent defined by the surrounded portion of the semiconductor body, a portion of the gate region overlying portions of both the annular first region and annular second region, and being in physical contact with a gate region of an adjacent cell; and
at least one clamping region of the second conductivity type formed in the surrounded portion of the semiconductor body, and having a voltage breakdown lower than a voltage breakdown of the annular first region and annular second region, wherein the clamping region has a cross-sectional shape differing from that of the annular second region and a depth and doping level the same as that of the annular second region.

17. The transistor of claim 16, wherein each cell includes a plurality of clamping regions.

18. The transistor of claim 16, wherein the gate region is in physical contact with the gate region of each adjacent cell.

* * * * *